United States Patent
Hung et al.

(10) Patent No.: US 7,190,604 B2
(45) Date of Patent: Mar. 13, 2007

(54) CAPACITY DIVIDABLE MEMORY IC

(75) Inventors: Chi-Cheng Hung, Hsinchu (TW);
Ling-Yueh Chang, Hsinchu (TW);
Pwu-Yueh Chung, Chunli (TW)

(73) Assignee: Lyontek Inc., Hsinchu (TW)

( * ) Notice: Subject to any disclaimer, the term of this patent is extended or adjusted under 35 U.S.C. 154(b) by 64 days.

(21) Appl. No.: 11/166,586

(22) Filed: Jun. 27, 2005

(65) Prior Publication Data

US 2006/0291264 A1   Dec. 28, 2006

(51) Int. Cl.
G11C 5/06 (2006.01)
G11C 8/00 (2006.01)
G11C 11/06 (2006.01)

(52) U.S. Cl. ............... 365/63; 365/72; 365/230.03; 365/244

(58) Field of Classification Search ............ 365/63, 365/230.03
See application file for complete search history.

(56) References Cited

U.S. PATENT DOCUMENTS

| | | | | |
|---|---|---|---|---|
| 4,752,118 | A * | 6/1988 | Johnson | 349/54 |
| 5,812,814 | A * | 9/1998 | Sukegawa | 711/103 |
| 5,949,139 | A * | 9/1999 | Imura et al. | 257/723 |
| 6,067,249 | A * | 5/2000 | Lee et al. | 365/185.05 |
| 6,225,691 | B1 * | 5/2001 | Shen | 257/692 |
| 6,324,114 | B1 * | 11/2001 | Himeno | 365/230.03 |
| 6,741,486 | B2 * | 5/2004 | Sakui | 365/51 |
| 6,765,813 | B2 * | 7/2004 | Scheuerlein et al. | 365/51 |
| 6,836,010 | B2 * | 12/2004 | Saeki | 257/694 |
| 6,873,563 | B2 * | 3/2005 | Suwa et al. | 365/230.03 |
| 2002/0089050 | A1 * | 7/2002 | Michii et al. | 257/686 |
| 2003/0057566 | A1 * | 3/2003 | Huang et al. | 257/777 |
| 2003/0214344 | A1 * | 11/2003 | Suwa et al. | 327/530 |
| 2003/0223198 | A1 * | 12/2003 | Kato et al. | 361/719 |
| 2004/0136218 | A1 * | 7/2004 | Magnavacca et al. | 365/51 |
| 2005/0093143 | A1 * | 5/2005 | Chiang et al. | 257/723 |
| 2005/0190624 | A1 * | 9/2005 | Kasai | 365/222 |
| 2006/0030080 | A1 * | 2/2006 | Hsueh et al. | 438/126 |
| 2006/0227524 | A1 * | 10/2006 | Hsu | 361/796 |

FOREIGN PATENT DOCUMENTS

EP      847086 A2 *   6/1998
JP      61059865 A *   3/1986

* cited by examiner

*Primary Examiner*—Amir Zarabian
*Assistant Examiner*—Ly Duy Pham
(74) *Attorney, Agent, or Firm*—H. C. Lin, Patent Agent

(57) ABSTRACT

Two memory areas on a wafer are coupled through pass transistors to double the memory capacity of each area and can be sawed to yield two memory chips each with single memory area. A pair of pass transistors are used to couple each dedicated functional pad in both memory areas, when the pass transistors are turned on. The connection between the pass transistor pair can be sawed through to yield single capacity memory dice. The memory capacity can be further increased by coupling more memory areas together with pass transistors.

1 Claim, 5 Drawing Sheets

CAPACITY DIVIDABLE MEMORY IC

BACKGROUND OF THE INVENTION

1. Field of the Invention

This invention relates to memory integrated circuit (IC), in particular to memory IC which can be divided to yield different capacity memories.

2. Brief Description of Related Art

FIG. 1 shows a prior art memory IC 10 as an example. Each IC chip can yield a single capacity memory. If a half capacity memory is needed, one half of memory is left unused and wasted, because there is no way to cut the memory into half capacity memory. If it is desired to reduce cost and to double the profit, a different product must be designed using different sets of production masks. When a customer requires different capacity memory ICs, a different set of dedicated masks must be provided for each memory capacity. In other words, each set of masks can only yield a single capacity memory.

SUMMARY OF THE INVENTION

An object of the present invention is to provide a memory layout which can yield different capacity memories. Another object of the invention is to provide a memory layout which can furnish memory IC with half of the memory capacity through physically cutting half of the original memory IC. Still another object of the invention is to use the same of masks to divide and subdivide the memory capacity of an IC. A further object of the present invention is to prevent material damage when a chip is sawed to yield two half capacity memory areas.

These objects are achieved by dividing the IC into multiple areas. Each area has its own complement of bonding pads such as that for power supplies, input/output, controls, etc. The corresponding pads in each area are interconnected with pass transistors. When the pass transistors between two memory areas are turned on, the adjoining areas are interconnected to double the memory capacity. When the pass transistors between two memory areas are turned off, the two memory areas can be sawed into two halves to yield two memory products with half of the memory capacity.

DETAILED DESCRIPTION OF THE INVENTION

Figure 1:
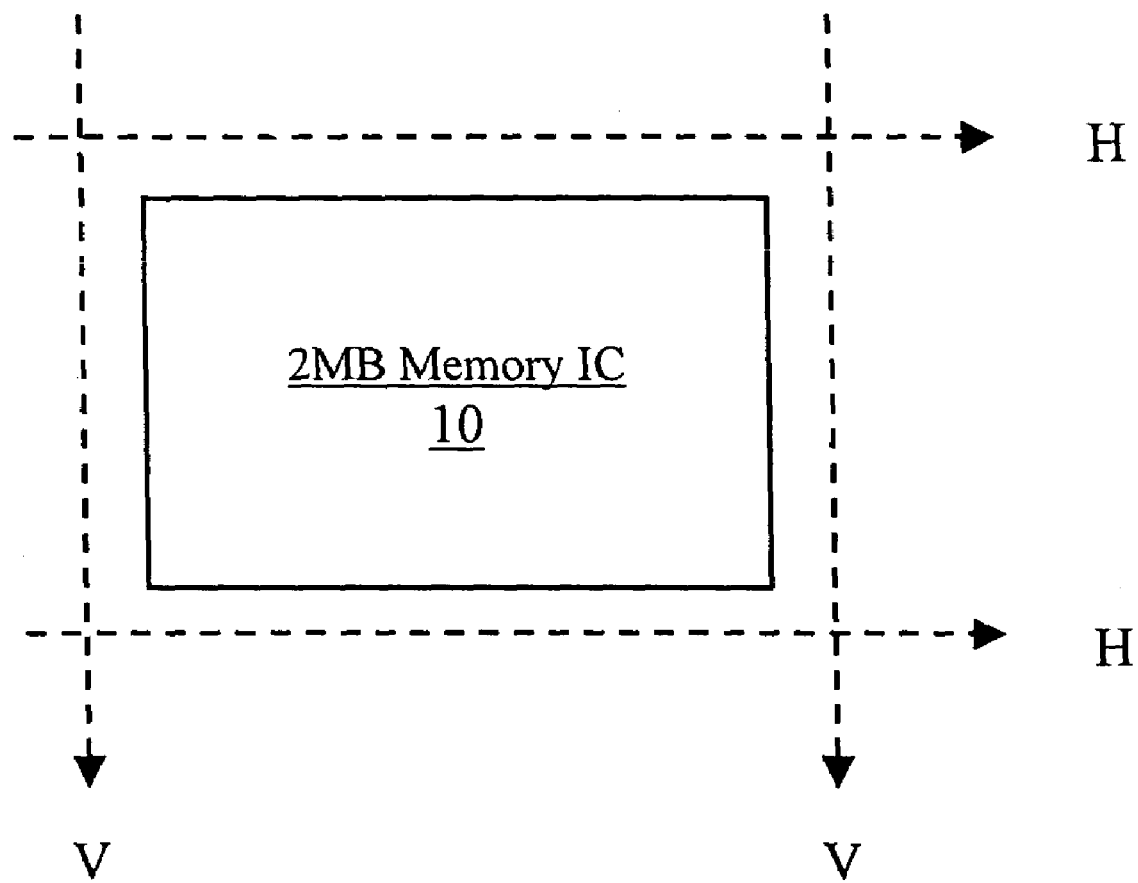
FIG. 1 shows a prior art memory chip.
Figure 2:
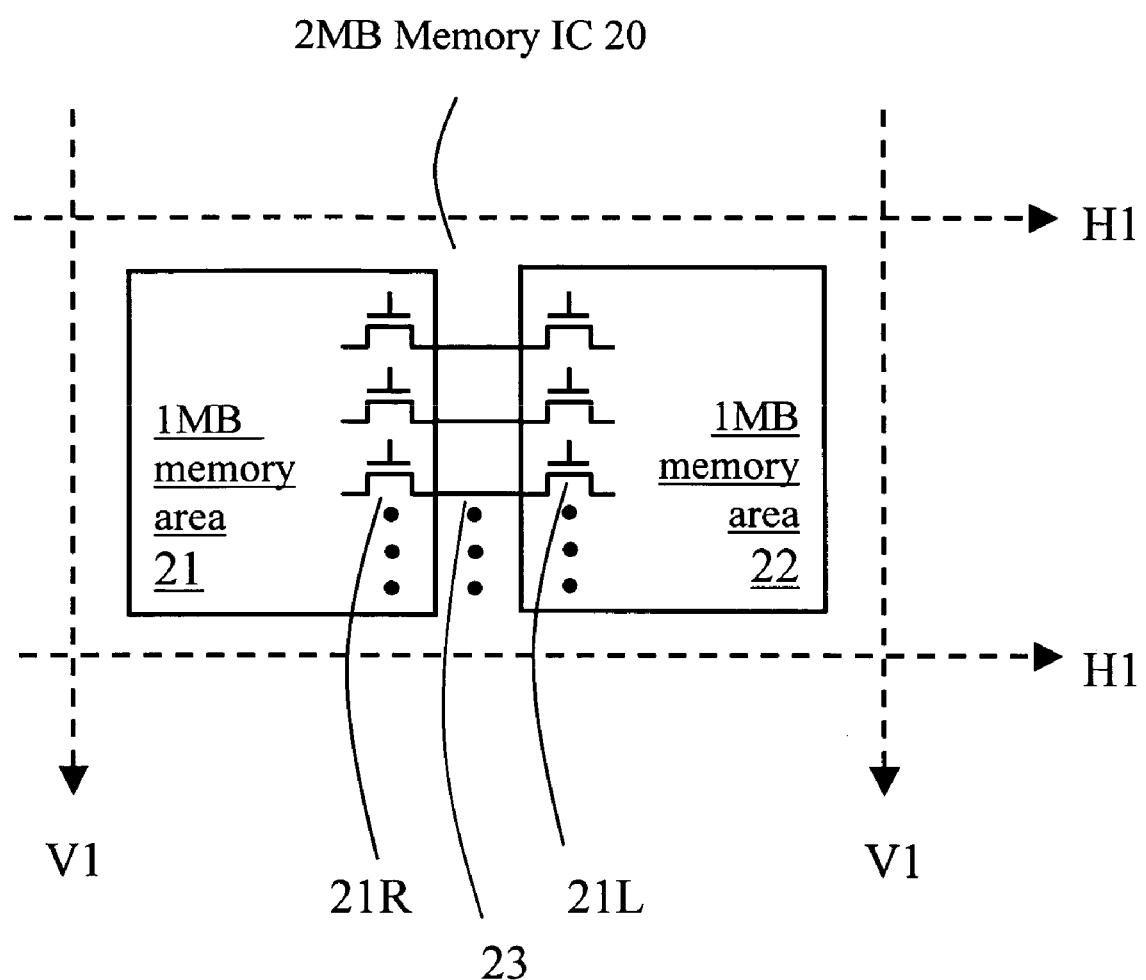
FIG. 2 shows the basic concept of the present invention interconnecting two adjoining areas with pass transistors to increase the memory capacity.
Figure 5:
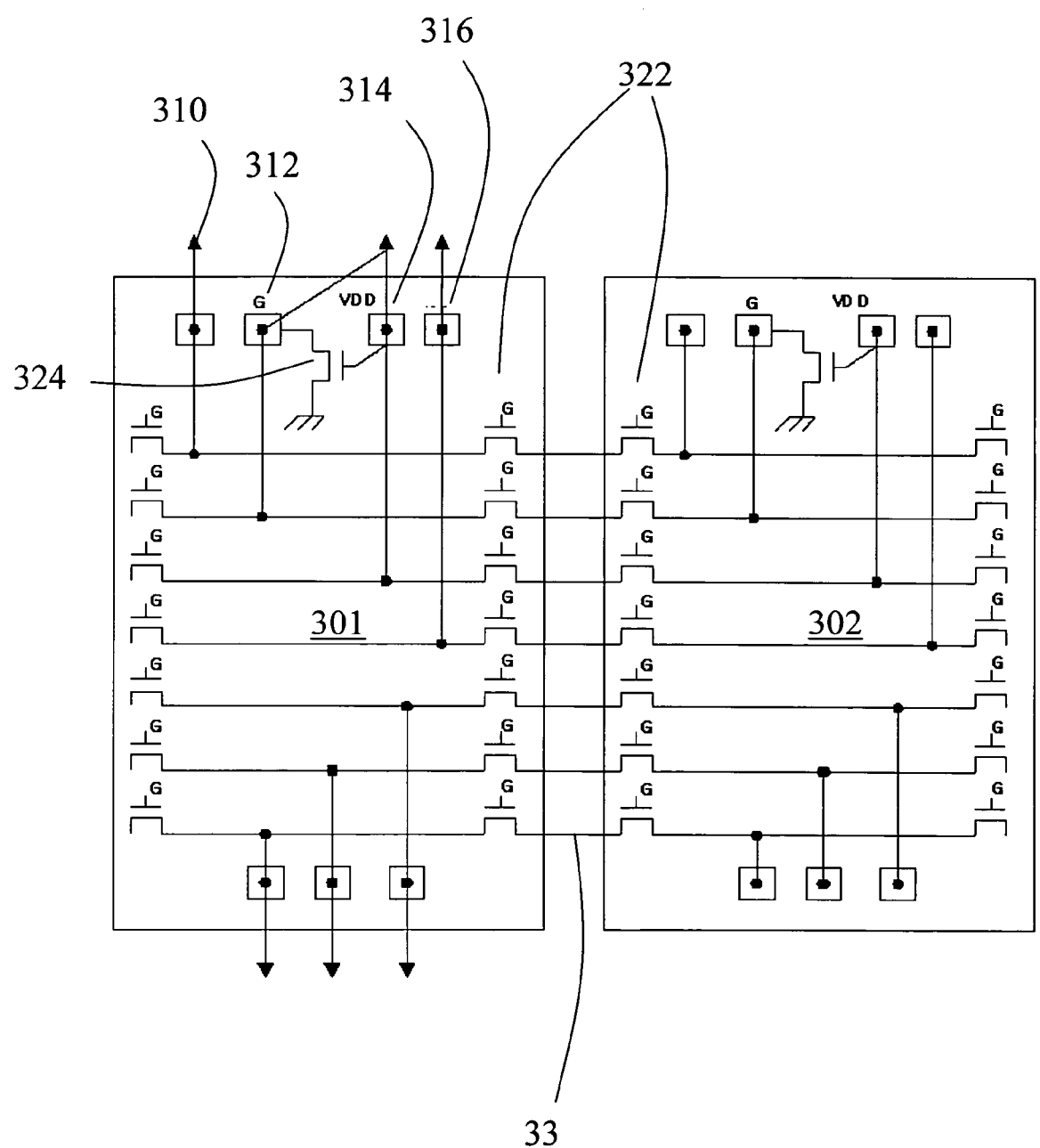
FIG. 5 shows the connection of the pass transistors to each functional bonding pads to connect the corresponding bonding pads of two adjoining memory areas.

FIG. 2 shows the basic concept of the present invention. Two 1 MB memory areas 21 and 22 on a common substrate are joined together to form a 2 MB memory IC 20. The adjoining sides of the two areas are lined with pass transistors: pass transistors 21R at the left memory area 21, and pass transistor 21L at the right memory area 22. These pass transistors are MOSFETs, connected with interconnections 23. The gates of the pass transistors along the same column are in common. The pass transistors are turned on and off by applying a control signal at the common gates. Each pass transistor is connected to a functional bonding pad such as positive power supply VDD, Ground GD, signal pads, etc. of the individual memory area as shown in FIG. 5. Each adjoining pair of the pass transistors corresponds to a dedicated functional pad. When the adjoining pass transistors are turned on or activated, the two 1 MB memory areas 21 and 22 are connected in parallel, and the memory capacity is doubled to become a 2 MB memory IC 20. The wafer can be sawed along the horizontal scribe lines H1 and vertical scribe lines V1 to yield 2 MB memory dice.

Figure 3:
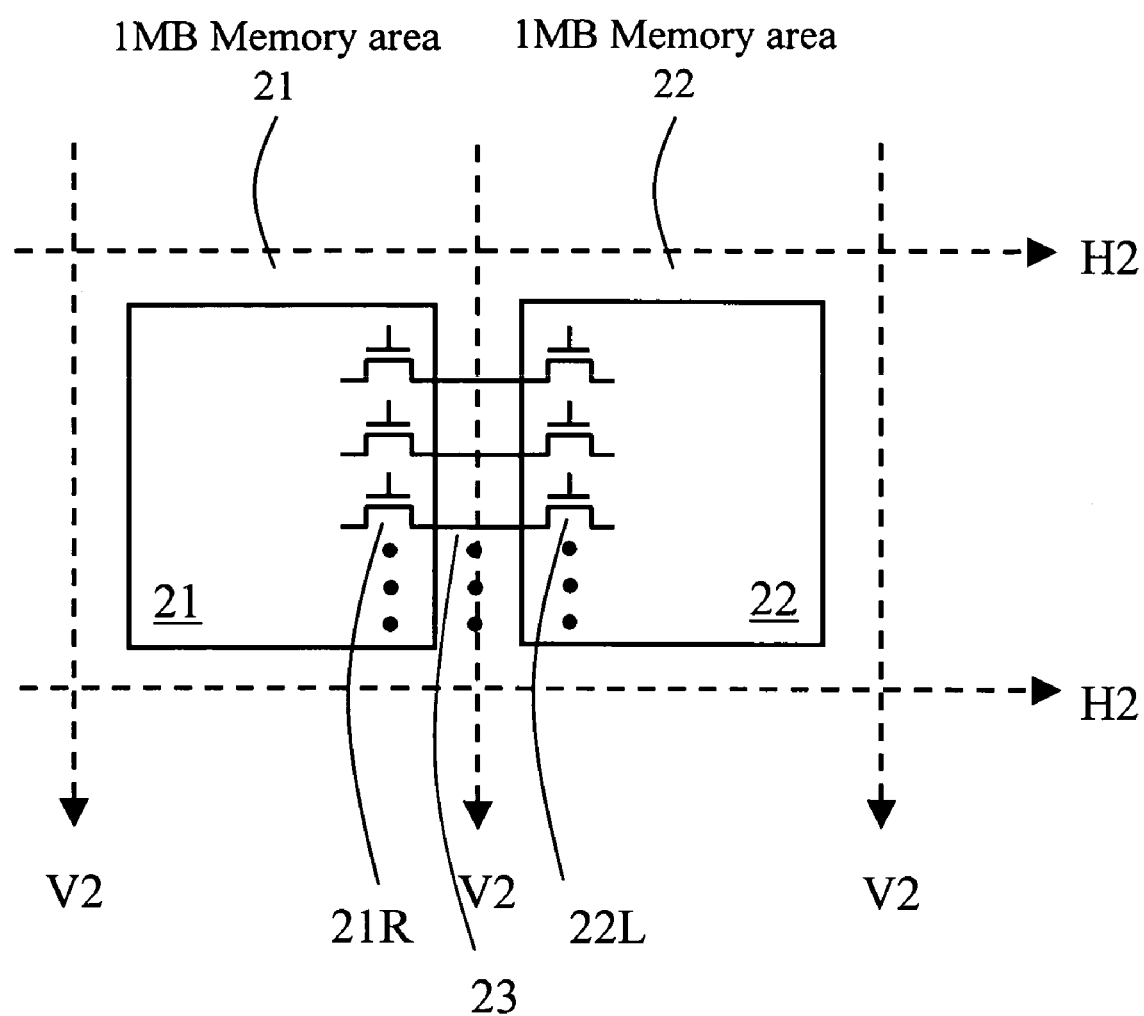
FIG. 3 shows the sawing of two adjoining areas to yield two single capacity memory dice.

When the pass transistors 21R and 21L of adjoining memory are turned off, each memory area 21 or 22 becomes single capacity 1 MB memory as shown in FIG. 3. The wafer can be sawed along the horizontal scribe lines H2 and vertical scribe lines V2 to yield individual 1 MB memory dice. The vertical sawing V2 cuts through the interconnections 23. If there is any damage including shot circuit between the metal lines caused by sawing, the damage does not propagate to the active memory areas 21, 22, because the damage is buffered by the pass transistors 21R, 21L.

Figure 4:
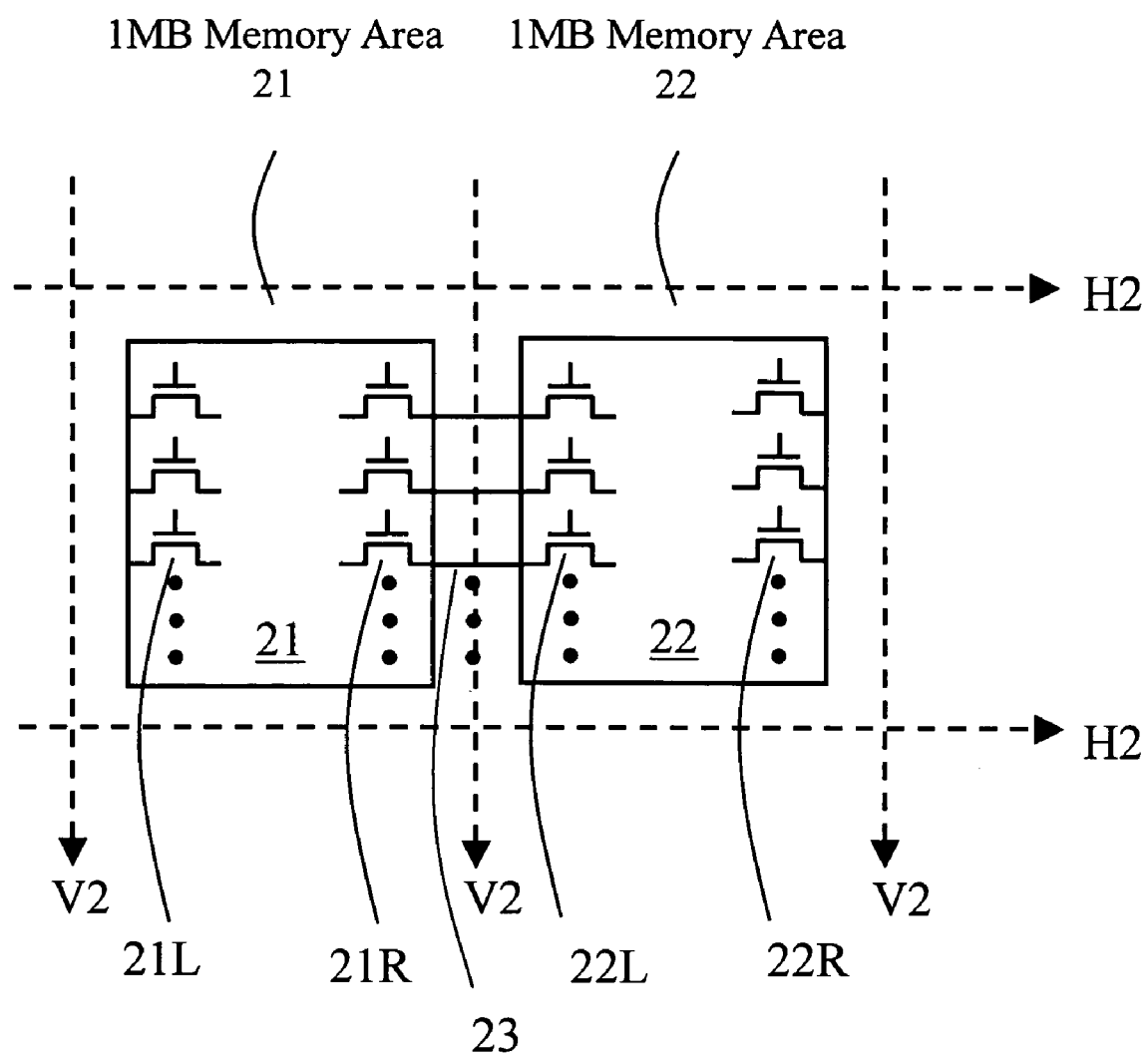
FIG. 4 shows the addition of pass transistors for multiplying the memory capacity.

FIG. 4 shows provision how more than two memory areas can be adjoined to further increase the memory capacity. Both vertical edges of each memory area are lined with pass transistors, e.g. 21L, 21R for the memory area 21, and 22L and 22R for the memory area 22. Then the pass transistors 22R can be interconnected to a third memory area (not shown) to the right, and the pass transistors 21L can be interconnected to a fourth memory area (not shown) to the left. In this manner, the memory capacity can be tripled or quadrupled.

FIG. 5 shows how the pass transistors shown in FIG. 4 are connected to the various functional bonding pads. The pass transistors along the same horizontal direction within the same memory area, say 301, are one by one connected with horizontal interconnections. Each horizontal interconnection is connected to a particular functional bonding pad along the horizontal edges of the area, e.g. the positive power supply VDD pad 314; the ground pad 312, which is activated by transistor 324 when VDD is applied; a signal pad 310; a control signal pad 316; etc. When the two columns of the pass transistors 322 are turned on, the power pads 314,312 and signal pads 310,316 etc. in memory area 301 are connected to the corresponding pads in memory area 302, and the two memory areas are connected in parallel to double the memory capacity. Note that once power pad 314, signal pad 310, control signal pad 316, etc. are inputted or outputted in memory area 301, there is no need to input or output the corresponding pads in memory pads in memory area 302 i.e. the pads on either memory area 301 or memory area 302 are wire-bonded for input or output for a 2 MB product composed memory area 301 and memory area 302.

While the embodiments of the present invention have been described, it will be apparent to those skilled in the art that various modifications can be made to the embodiments without departing from the spirit of this invention. Such modifications are all within the scope of this invention.

The invention claimed is:

1. A dividable memory IC, comprising:
   two neighboring memory areas, each having plurality of functional pads; and pass transistors connecting corresponding said functional pads in said two memory areas respectively, when the pass transistors are turned on, thereby doubling the memory capacity, wherein said pass transistors are aligned along the neighboring edges of said two memory areas, and, wherein said pass transistors within each of said memory areas are connected with horizontal interconnections, and corresponding said pass transistors in said two memory areas are connected together.

* * * * *